United States Patent
Larsson et al.

[11] Patent Number: 5,835,046
[45] Date of Patent: Nov. 10, 1998

[54] ANALOG-TO-DIGITAL CONVERTER FOR DIFFERENTIAL SIGNALS

[75] Inventors: Patrik Larsson, Matawan; Per Magnusson, Hazlet, both of N.J.

[73] Assignee: Lucent Technologies Inc., Murray Hill, N.J.

[21] Appl. No.: 787,651

[22] Filed: Jan. 23, 1997

[51] Int. Cl.⁶ .................................................. H03M 1/12
[52] U.S. Cl. .......................... 341/155; 341/159; 341/160
[58] Field of Search ....................................... 341/155, 159, 341/160

[56] References Cited

U.S. PATENT DOCUMENTS

| | | | |
|---|---|---|---|
| 5,204,679 | 4/1993 | Jessner et al. ........................... | 341/159 |
| 5,416,484 | 5/1995 | Lofstrom ................................. | 341/159 |
| 5,444,447 | 8/1995 | Wingender ............................. | 341/156 |
| 5,539,406 | 7/1996 | Kouno et al. .......................... | 341/155 |
| 5,589,831 | 12/1996 | Knee ....................................... | 341/159 |

*Primary Examiner*—Marc S. Hoff
*Assistant Examiner*—Jason L. W. Kost
*Attorney, Agent, or Firm*—Eugene J. Rosenthal

[57] ABSTRACT

For certain high-speed applications, where high-precision is not required analog-to-digital conversion may be performed by employing several comparators, each having their own offset. Each such comparator with an offset may be constructed by employing a differential amplifier with an offset followed by a conventional comparator. Advantageously, the time to obtain a conversion to digital of an analog sample is reduced in comparison to prior art converters, thus enabling high-speed operation.

16 Claims, 2 Drawing Sheets

ANALOG-TO-DIGITAL CONVERTER FOR DIFFERENTIAL SIGNALS

TECHNICAL FIELD

This invention relates to analog-to-digital converters, and, more specifically, to analog-to-digital converters for differential signals.

BACKGROUND OF THE INVENTION

Prior art analog-to-digital converters for differential signals often use offset cancellation combined with subtraction of reference voltages. However, disadvantageously, for certain high-speed applications, offset cancellation takes too much time and too much chip area because it requires capacitors that must be charged for each sample to be converted.

SUMMARY OF THE INVENTION

We have recognized that for certain high-speed applications, where high-precision is not required, offset cancellation can be dispensed with and a different architecture employed for performing the analog-to-digital conversion. In particular, we employ a comparator with an offset. Such a comparator with an offset may be constructed by employing a differential amplifier with an offset followed by a conventional comparator. Advantageously, the time to obtain a conversion to digital of an analog sample is reduced in comparison to prior art converters, thus enabling high-speed operation.

DETAILED DESCRIPTION

Figure 1:
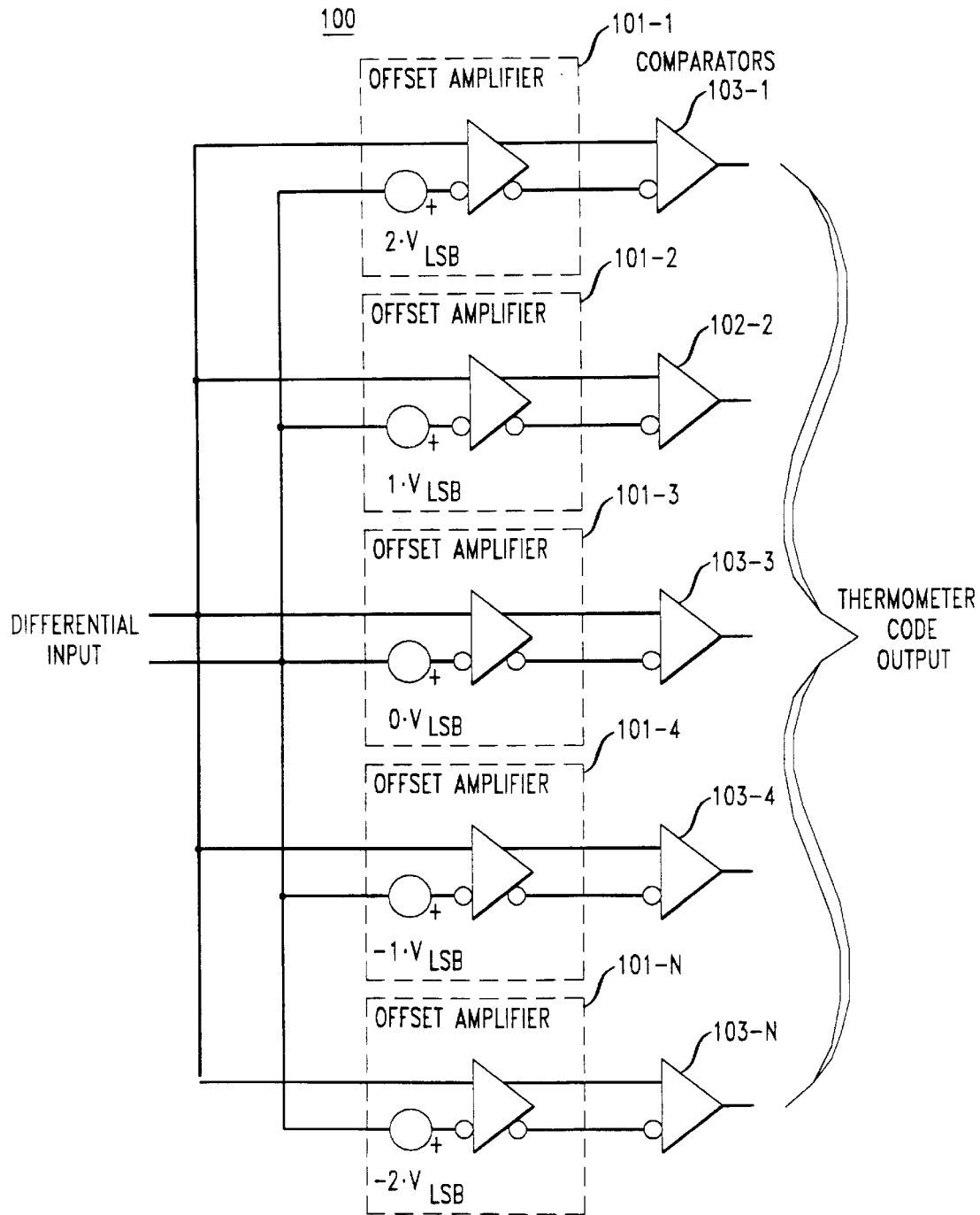
FIG. 1 shows exemplary analog-to-digital converter for differential signals in accordance with the principles of the invention.

FIG. 1 shows exemplary analog-to-digital converter 100 for differential signals in accordance with the principles of the invention. Analog-to-digital converter 100 includes differential offset amplifiers 101, and in particular differential offset amplifiers 101-1 to 101-N, and comparators 103, which includes conventional comparators 103-1 to 103-N. Each pair of like-suffixed ones of differential offset amplifiers 101 and comparators 103 form a comparator with an offset.

Conceptually, as shown in FIG. 1, each of differential offset amplifiers 101 is made up of a conventional differential amplifier and an offset voltage source. The offset voltage for each differential amplifier differs from that of any other differential amplifier by the value represented by a multiple of the least significant bit (LSB) of the output of analog-to-digital converter 100. In the embodiment show in FIG. 1, when N=5, the offset voltages are arranged to increase in uniform steps by the voltage represented by a multiple of the least significant bit ($V_{LSB}$) from a low of negative two times $V_{LSB}$ for offset amplifier 101-N to a high of positive two times $V_{LSB}$ for offset amplifier 101-1, with the step size being $V_{LSB}$.

The differential signal to be converted is supplied as an input to each of offset amplifiers 101. Again, conceptually, each of offset amplifiers 101 subtracts the offset voltage that is supplied to it from the input voltage and then amplifies the result. The output-conceptually, as noted, the amplified difference-from each of differential offset amplifiers 101 is supplied to a respective one of comparators 103.

Each of comparators 103 determines the sign of the differential signal supplied to it as an input. If the sign is positive, the comparator will output a logic "1". If the sign is negative, the comparator will output a logic "0". The result is that comparators 103 supply a so-called "thermometer" code as an overall output which represents the value of the differential input signal. This thermometer code may then be converted to a binary code representation using conventional, well known, techniques.

Note that the offset amplifier which has a zero offset may be dispensed with, and the differential input signal supplied directly to the one of comparators 103 which would otherwise be used for the zero offset amplified signal.

Figure 2:
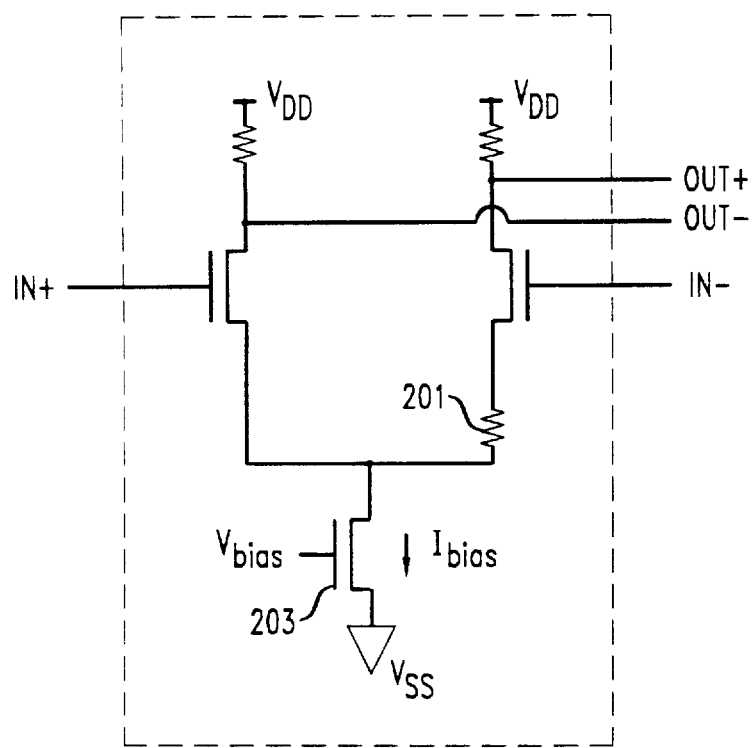
FIG. 2 shows an exemplary embodiment of an offset amplifier for use in the analog-to-digital converter for differential signals of FIG. 1.

For completeness, FIG. 2 shows an exemplary embodiment of offset amplifier 101-1. Such offset amplifiers are known in the art. In particular, the offset voltage described above is a function of offset resistor 201 and the bias current through transistor 203. For example, with a constant bias current, doubling the offset resistance essentially doubles the offset voltage. Likewise, with a constant offset resistance, doubling the bias current essentially doubles the offset voltage. Note that the foregoing assumes that the transistors remain operating in their proper operating regions. Further note, the exact offset voltage is not critical. Instead it is the matching between the different offset voltages that determines the linearity of the analog-to-digital converter.

Advantageously, the offset amplifier is a continuous time amplifier that does not depend on capacitors for its operation, resulting in faster conversion speed.

The foregoing merely illustrates the principles of the inventions. It will thus be appreciated that those skilled in the art will be able to devise various arrangements which, although not explicitly described or shown herein, embody the principles of the invention and are included within its spirit and scope.

What is claimed is:

1. An analog-to-digital converter for differential signals, comprising:

a comparator with an offset generated by a differential amplifier having a built in offset; and a conventional comparator;

wherein said comparator with an offset and said conventional comparator are supplied with the same differential input signal.

2. The invention as defined in claim 1 wherein said comparator with an offset generated by a differential amplifier having a built in offset comprises:

a second conventional comparator; and a differential amplifier having a built in offset, the output of said differential amplifier being coupled to inputs of said second conventional comparator.

3. The invention as defined in claim 2 wherein said differential amplifier has substantially unity gain.

4. An analog-to-digital converter for differential signals, comprising:

a capacitor-free comparator with an offset; and a conventional comparator;

wherein said comparator with an offset and said conventional comparator are supplied with the same differential input signal.

5. The invention as defined in claim 4 wherein said capacitor-free comparator with an offset comprises:

a second conventional comparator; and a differential amplifier having a built in offset, the output of said differential amplifier being coupled to inputs of said second conventional comparator.

6. The invention as defined in claim 5 wherein said differential amplifier has substantially unity gain.

7. An analog-to-digital converter for differential signals, comprising:

a first comparator with an offset generated by a differential amplifier having a first built in offset; and a second comparator with an offset generated by a differential amplifier having a second built in offset;

wherein said first and second comparators with an offset are supplied with the same differential input signal.

8. The invention as defined in claim 7 wherein said first and second comparators with an offset generated by a differential amplifier having a built in offset each comprises:

a conventional comparator; and a differential amplifier having a built in offset, the output of said differential amplifier being coupled to inputs of said conventional comparator.

9. The invention as defined in claim 8 wherein said differential amplifier has substantially unity gain.

10. An analog-to-digital converter for differential signals, comprising:

a first capacitor-free comparator with a first built in offset; and a second capacitor-free comparator with a second built in offset;

wherein said first and second comparators with an offset are supplied with the same differential input signal.

11. The invention as defined in 10 wherein said first and second capacitor-free comparators each comprises:

a conventional comparator; and a differential amplifier having a built in offset, the output of said differential amplifier being coupled to inputs of said conventional comparator.

12. An analog-to-digital converter for differential signals, comprising:

a comparator with an offset generated by a continuous-time amplifier having a built in offset; and a conventional comparator;

wherein said comparator with an offset and said conventional comparator are supplied with the same differential input signal.

13. The invention as defined in claim 12 wherein said comparator with an offset generated by a continuous-time amplifier having a built in offset comprises:

a second conventional comparator; and a differential continuous-time amplifier having a built in offset, the output of said differential amplifier being coupled to inputs of said second conventional comparator.

14. An analog-to-digital converter for differential signals, comprising:

a first comparator with an offset generated by a first continuous-time amplifier having a first built in offset; and a second comparator with an offset generated by a second continuous-time amplifier having a second built in offset;

wherein said first and second comparators with an offset are supplied with the same differential input signal.

15. The invention as defined in claim 14 wherein said first and second comparators with an offset each comprises:

a conventional comparator; and a continuous-time differential amplifier having a built in offset, the output of said continuous-time differential amplifier being coupled to inputs of said conventional comparator.

16. An analog-to-digital converter for differential signals, comprising:

a first differential amplifier, said first differential amplifier having a built in non-zero offset and having its output coupled to a first comparator; and a second differential amplifier, said second differential amplifier having a built in offset of substantially zero and having its output coupled to a second comparator;

wherein said first differential amplifier and said second differential amplifier are supplied with the same differential input signal.

* * * * *